United States Patent [19]

Beiley et al.

[11] Patent Number: 5,532,622

[45] Date of Patent: Jul. 2, 1996

[54] MULTI-INPUT TRANSITION DETECTOR WITH A SINGLE DELAY

[75] Inventors: Mark A. Beiley, Burlington; John A. Fifield, Underhill, both of Vt.

[73] Assignee: International Business Machines Corporation, Armonk, N.Y.

[21] Appl. No.: 427,396

[22] Filed: Apr. 24, 1995

[51] Int. Cl.$^6$ .................................................. H03K 19/096
[52] U.S. Cl. .......................... 326/95; 326/98; 326/121; 327/172; 327/176; 327/354
[58] Field of Search .................................. 327/172, 176, 327/392, 394, 400; 326/95, 98, 121, 122, 119

[56] References Cited

U.S. PATENT DOCUMENTS

| | | | |
|---|---|---|---|
| 4,862,020 | 8/1989 | Cowan et al. | 327/172 |
| 4,963,765 | 10/1990 | Kadakia et al. | 326/83 |
| 5,198,709 | 3/1993 | O'Connell | 326/98 |
| 5,264,737 | 11/1993 | Oikawa | 327/172 |
| 5,306,958 | 4/1994 | Roddy et al. | 327/172 |
| 5,306,963 | 4/1994 | Leak et al. | 326/93 |
| 5,327,394 | 7/1994 | Green et al. | 326/93 |
| 5,357,480 | 10/1994 | Vinal | 326/93 |
| 5,426,390 | 6/1995 | Yabe et al. | 327/172 |
| 5,465,062 | 11/1995 | Fong | 327/172 |

*Primary Examiner*—Edward P. Westin
*Assistant Examiner*—Benjamin D. Driscoll
*Attorney, Agent, or Firm*—Whitham, Curtis, Whitham & McGinn; Charles W. Peterson

[57] ABSTRACT

A transition detector circuit produces an output pulse upon detection of a transition at any one of several input nodes using a single delay path so all input transitions produce the same output pulse width and with only one gate delay in the circuit. The circuit includes precharging means, coupled between the plurality of transitioning inputs and the output node, for charging the output node high. The precharging means comprises stacked field effect transistor (FET) devices, each having a gate connected to a respective one of the transitioning inputs. A first charging device for charging the output node high is coupled to the output node. A second charging device for discharging the output node low is coupled to the output node. A single delay means, coupled between the plurality of transitioning inputs and both the first and second charging devices, both turns off the first charging device and turns on the second charging device. Switching means, controlled by the plurality of transitioning inputs and coupled between the output node and the second charging device, disconnects the second charging device from the output node.

6 Claims, 4 Drawing Sheets

5,532,622

MULTI-INPUT TRANSITION DETECTOR WITH A SINGLE DELAY

BACKGROUND OF THE INVENTION

1. Field of the Invention

The present invention generally relates to semiconductor transition circuits and, more particularly, to a circuit that produces an output pulse upon detection of a transition of any one of several input nodes.

2. Description of the Prior Art

The traditional method to generate an output pulse from a transitioning input pulse is to use a one shot pulse generator. For multiple input signals, the standard method is to generate a one shot pulse from each input, then logically OR the signals to produce the output pulse. In this latter case, there is a resultant three-gate delay that degrades system performance.

SUMMARY OF THE INVENTION

It is therefore an object of the present invention to provide a transition detector circuit that produces an output pulse upon detection of a transition at any one of several input nodes using a single delay path so all input transitions produce the same output pulse width and with only one gate delay in the circuit.

According to the invention, there is provided a circuit for producing a pulse on an output node from any one of a plurality of transitioning inputs. The circuit includes precharging means, coupled between the plurality of transitioning inputs and the output node, for charging the output node high. The precharging means comprises stacked field effect transistor (FET) devices, each having a gate connected to a respective one of the transitioning inputs. A first charging device for charging the output node high is coupled to the output node. A second charging device for discharging the output node low is coupled to the output node. A single delay means, coupled between the plurality of transitioning inputs and both the first and second charging devices, both turns off the first charging device and turns on the second charging device. Switching means, controlled by the plurality of transitioning inputs and coupled between the output node and the second charging device, disconnects the second charging device from the output node.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
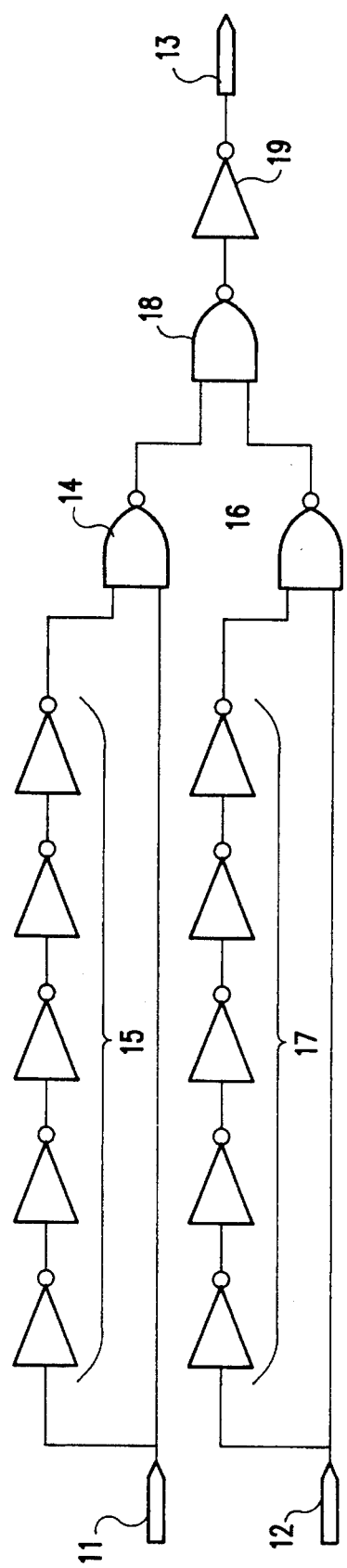
FIG. 1 is a logic diagram showing an example of a prior art multi-input transition detector.

Referring now to the drawings, and more particularly to FIG. 1, there is shown an example of a prior art multi-input transition detector. This circuit has two input nodes 11 and 12 and an output node 13. Input node 11 is directly connected to one input of NAND gate 14 and via a string of five inverters 15 to the second input of the NAND gate 14. Similarly, input node 12 is directly connected to one input of NAND gate 16 and via a string of five inverters 17 to the other input of NAND gate 16. The outputs of NAND gates 14 and 16 are connected to respective inputs of NAND gate 18, the output of which is inverted by inverter 19 before being applied to output node 13. While only two inputs are shown in this example, it will of course be understood that the same basic structure can support more than two inputs.

In the circuit shown in FIG. 1, the combination of the NAND gate 14 and inverter string 15, for example, function as a one shot where the inverter string 15 defines the delay period of the one shot. The combination of the NAND gate 18 and inverter 19 function as an OR gate. While the circuit of FIG. 1 functions to provide an output pulse on output node 13 for a transitioning input pulse on either of the input nodes 11 or 12, the resultant three gate delay degrades system performance.

Figure 2:
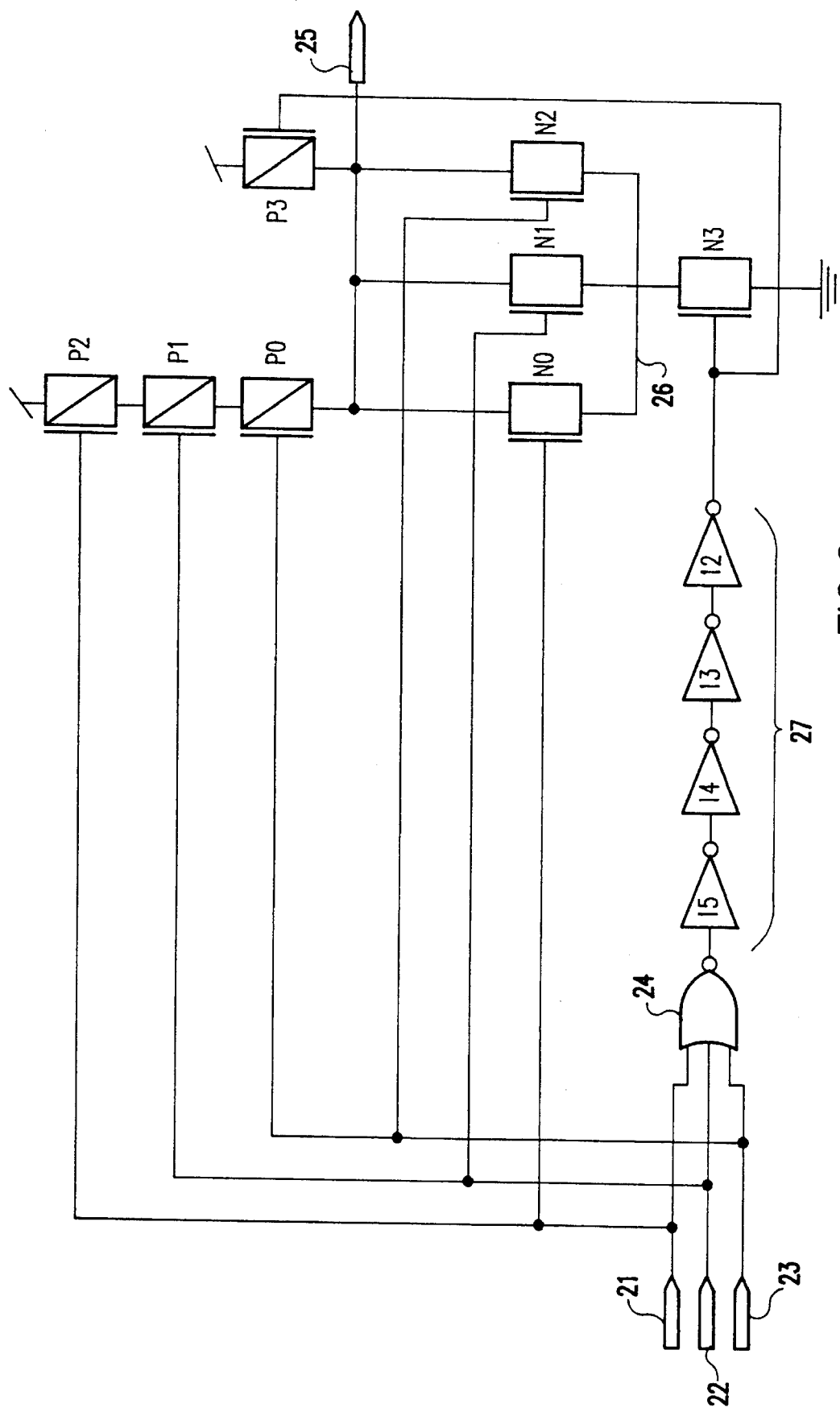
FIG. 2 is a logic and schematic diagram of a first preferred embodiment of the invention showing a multi-input transition detector using a single one shot generator and a set of stacked pull up devices.

FIG. 2 shows the first preferred embodiment of the invention, here shown with three input nodes 21, 22 and 23. These three nodes are connected to a respective one of the inputs of NOR gate 24 and to respective gates of p-channel field effect transistors (FETs) P0, P1 and P2. These three FETs are stacked, that is connected source to drain, between the voltage source and output node 25. These three stacked FETs are initially conducting, precharging the output node to the voltage source voltage. The three input nodes are also connected to respective gates of n-channel FETs N0, N1 and N2. These three FETs are connected in parallel, that is the drains of each of these FETs are connected in common to node output node 25 while their sources are connected in common to a second node 26. Node 26 is connected to circuit ground via an n-channel FET N3, and the gate of this n-channel FET is connected to receive the output of NOR gate 24 via a string of four inverters 27. The FET N3 acts as a discharging device for discharging the output node 25 low, while the FETs N0, N1 and N2 act as switches for connecting and disconnecting FET N3 to the output node. The output of the inverter string 27 is also connected to the gate of a p-channel FET P3 connected between the output node 25 and the voltage source. The FET P3 acts as a charging device for charging the output node 25 high.

Initially, FETs P0, P1 and P2 are on and FETs N0, N1 and N2 are off. A rising input signal at input node 21 turns off the pull-up path to output node 25 by turning off p-channel FET P2. The rising input at input node 21 also turns on n-channel FET N0, allowing pull down of output node 25 through n-channel FET N3. A delay path is formed by NOR gate 24 and the inverter string 27. The output of the inverter string will fall to ground some delay period after the rise of a rising input at input node 21. When the output of the inverter string 27 falls to circuit ground, n-channel FET N3 turns off and p-channel FET P3 turns on, returning the output node 25 high. The same response will occur for rising inputs to input nodes 22 and 23, but using n-channel FET N1 and p-channel FET P1 and n-channel FET N2 and p-channel FET P0, respectively.

Figure 3:
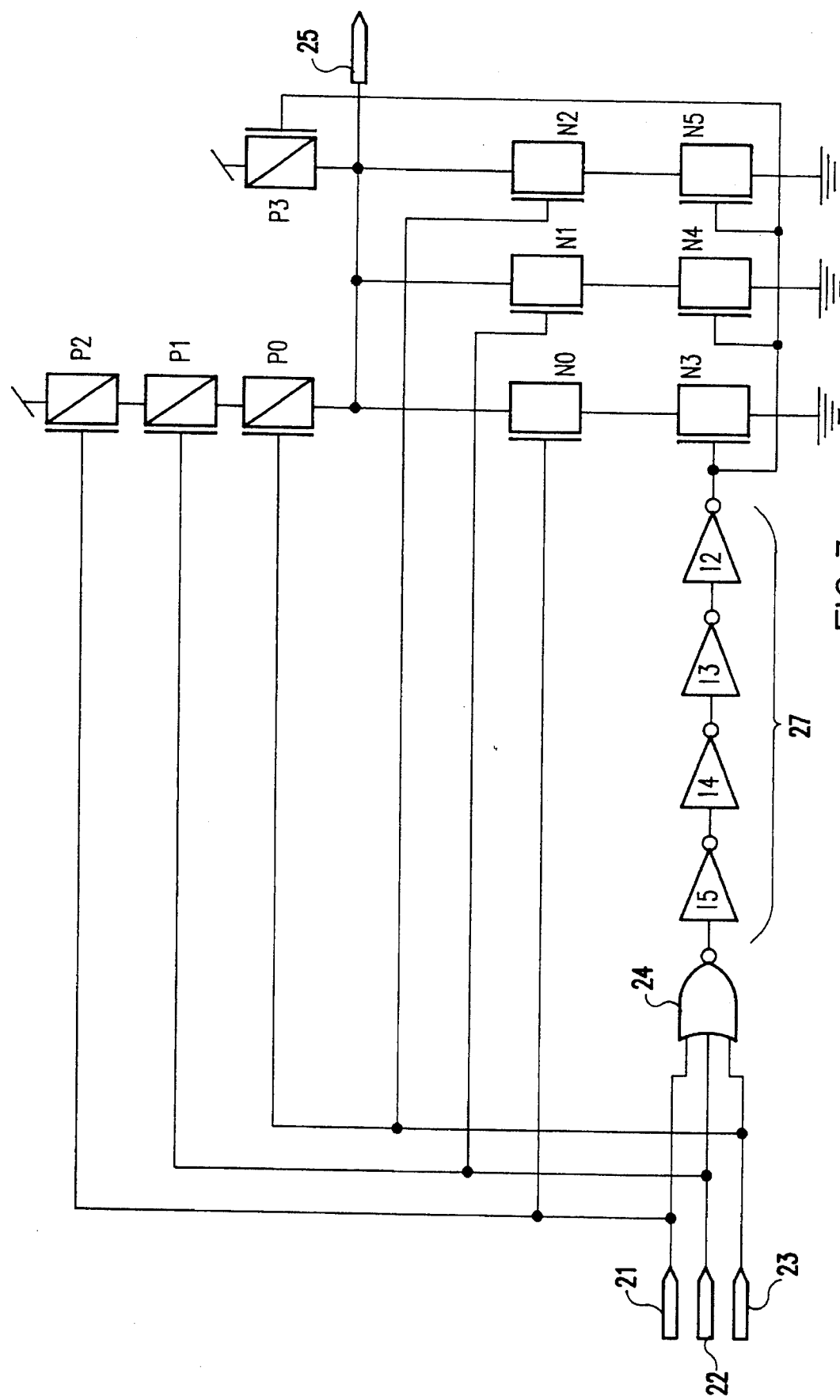
FIG. 3 is a logic and schematic diagram of a second preferred embodiment of the invention showing plural devices for discharging the output node low.

The second embodiment shown in FIG. 3 is similar to the first embodiment except instead of a single n-channel FET N3 connected between n-channel FETS N0, N1 and N2 and circuit ground, separate n-channel FETs N3, N4 and N5 are respectively connected between n-channel FETs N0, N1 and N2 and circuit ground. Each of the FETs N3, N4 and N5 function in the same manner as FET N3 in FIG. 1 to discharge the output node low. The operation of the second embodiment is substantially the same as the first embodiment.

Figure 4:
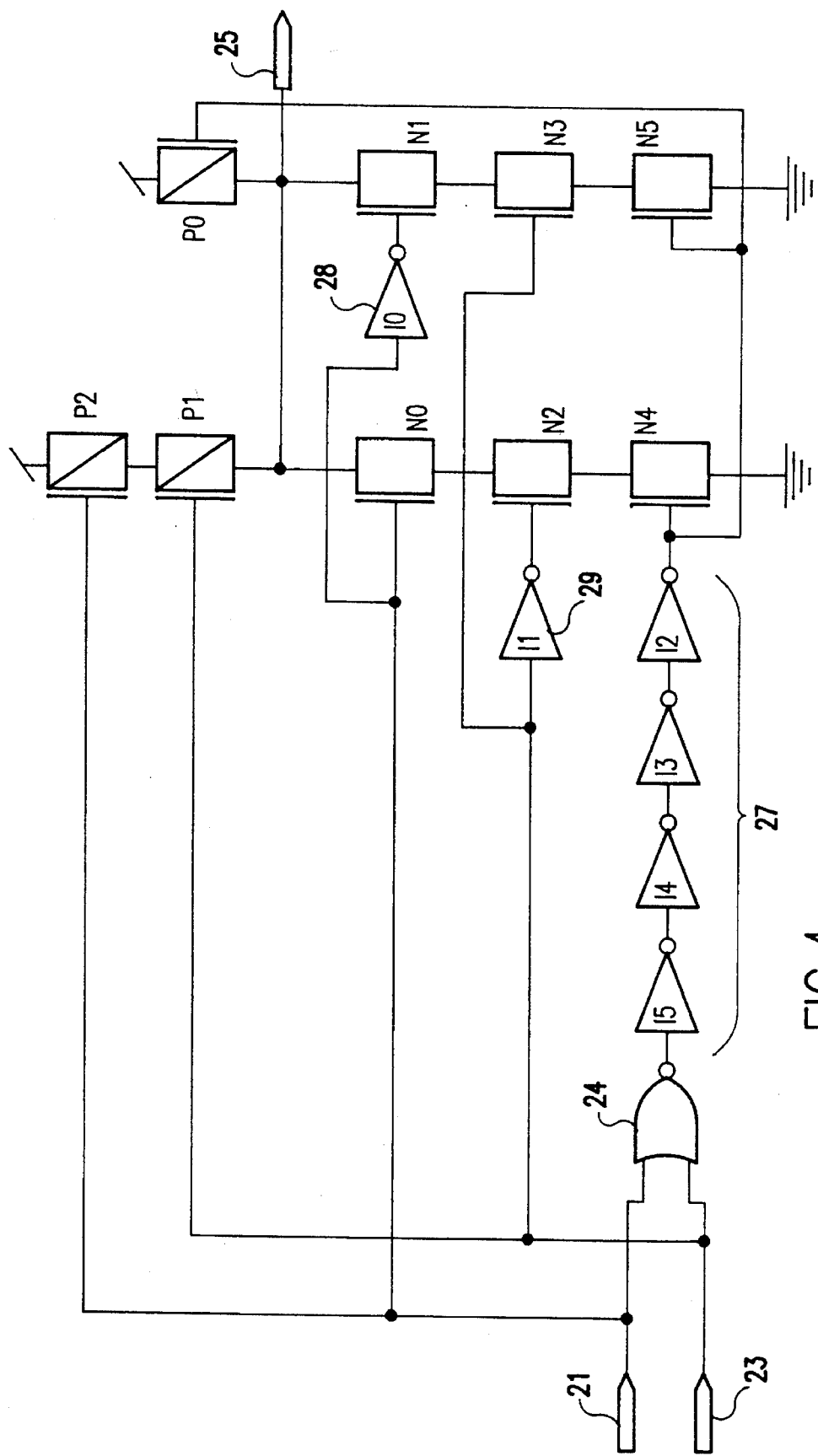
FIG. 4 is a logic and schematic diagram of a third preferred embodiment of the invention showing cross-coupled switching devices for selectively connecting and disconnecting the plural charging devices to the output node.

The third embodiment shown in FIG. 4, for the sake of simplicity, shows two input nodes 21 and 23 and, like the first two embodiments uses stacked p-channel FETs P1 and P2 to precharge the output node 25 high. This embodiment, however, uses stacked n-channel FETs N0, N2 and N4 and stacked n-channel FETs N1, N3 and N5. The gates of FETs N4 and N5 are connected to the output of the inverter string 27 as in the second embodiment shown in FIG. 3, and these two FETs act to discharge the output node 25 low. However, the input node 21 is connected directly to the gate of FET N0 and via inverter 28 to the gate of FET N1, and input node 23 is connected directly to the gate of N3 and via inverter 29 to the gate of FET N2. The combination of the FETs N0 and N1 with inverter 28 function as a cross-coupled switch, and the combination of FETs N2 and N3 with inverter 29 function as another cross-coupled switch.

In the operation of the third embodiment, a rising signal on input node 21 turns n-channel FET N0 on, but the output of inverter 28 turns n-channel FET N1 off. After some delay determined by the inverter string 27, the output of the inverter string 27 falls to ground turning n-channel FET N4 off and turning on p-channel FET P0, returning the output of output node 25 high.

While the invention has been described in terms of three preferred embodiments, those skilled in the art will recognize that the invention can be practiced with modification within the spirit and scope of the appended claims.

Having thus described our invention, what we claim as new and desire to secure by Letters Patent is as follows:

1. A circuit for producing a pulse on an output node from any one of a plurality of transitioning inputs, comprising:

precharging means, coupled between the plurality of transitioning inputs and the output node, for charging the output node to a first voltage level;

a first charging device for charging the output node to said first voltage level and coupled to the output node;

a second charging device for discharging the output node to a second voltage level different from said first voltage level;

a single delay means, coupled between the plurality of transitioning inputs and both the first and second charging devices, for both turning off the first charging device and turning on the second charging device; and switching means, controlled by said plurality of transitioning inputs and coupled between the output node and the second charging device, for disconnecting the second charging device from the output node.

2. The circuit recited in claim 1 wherein the precharging means comprises stacked field effect transistor (FET) devices, a gate of each FET device being coupled to a respective individual transitioning input.

3. The circuit recited in claim 2 wherein said stacked FET devices are a first conductivity type said first charging device is an FET device of said first conductivity type controlled by said single delay means and said second charging device comprises at least one FET device of a second conductivity type opposite said first conductivity type and controlled by said single delay means.

4. The circuit recited in claim 3 wherein said second charging device comprises a plurality of FET devices of said second conductivity type each having a gate connected to a respective one of the transitioning inputs.

5. The circuit recited in claim 3 wherein said switching means comprises a first plurality of FET devices of said second conductivity type connected between the output node and said at least one FET device of said second conductivity type, said first plurality of FET devices each having a gate connected to a respective one of the transitioning inputs.

6. The circuit recited in claim 5 wherein said switching means further includes a second plurality of FET devices of said second conductivity type, each FET device of said second plurality of FET devices being connected in series with a corresponding one of an FET device of said first plurality of FET devices, and a plurality of inverters connected between gates of the second plurality of FET devices and opposite ones of transitioning inputs.

* * * * *